United States Patent [19]

Price et al.

[11] 4,122,736

[45] Oct. 31, 1978

[54] APPARATUS AND METHOD FOR PERFORATING AN ARTICLE

[75] Inventors: Robert S. Price, Bicknell; Norman L. Eisman, Vincennes, both of Ind.

[73] Assignee: Universal Scientific Company, Vincennes, Ind.

[21] Appl. No.: 851,213

[22] Filed: Nov. 14, 1977

[51] Int. Cl.² .......................... B26D 7/00; B26D 7/08
[52] U.S. Cl. .................................. 83/23; 83/101; 83/146; 83/168
[58] Field of Search .................. 83/23, 101, 145, 146, 83/168

[56] References Cited

U.S. PATENT DOCUMENTS

| 1,932,571 | 10/1933 | Blood | 83/101 |
| 4,048,890 | 9/1977 | Aeschbach | 83/146 |

Primary Examiner—J. M. Meister
Attorney, Agent, or Firm—Posnack, Roberts, Cohen & Spiecens

[57] ABSTRACT

A punch apparatus is provided to punch holes in an article by the use of a die punch. The die punch is forced through the article to be punched. A cleaning device is extended into engagement with the die punch when the die punch is in a position penetrating the article. This enables a cleaning of the die punch. The cleaning device is then retracted so that the article can be detached from said die punch.

16 Claims, 5 Drawing Figures

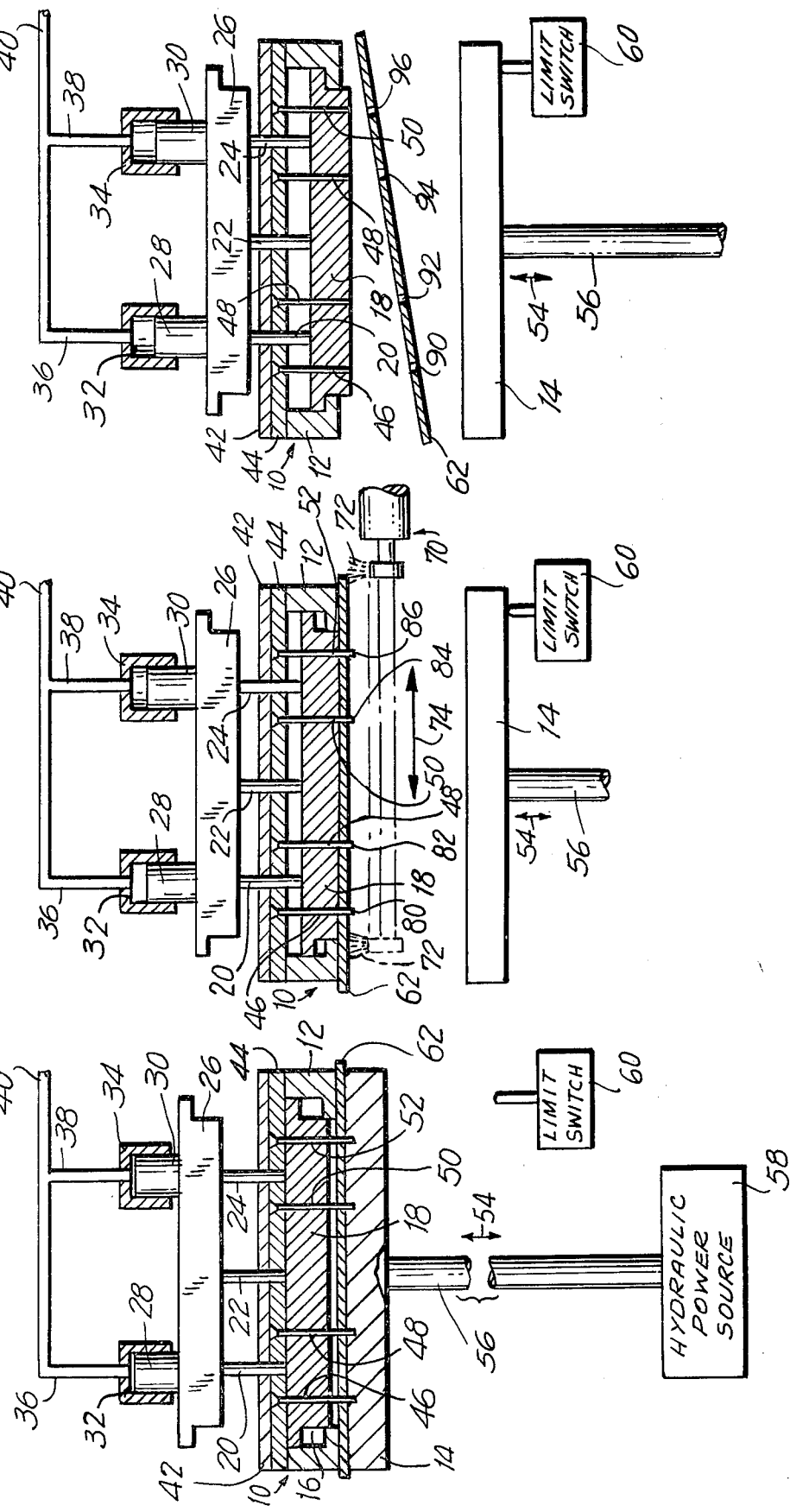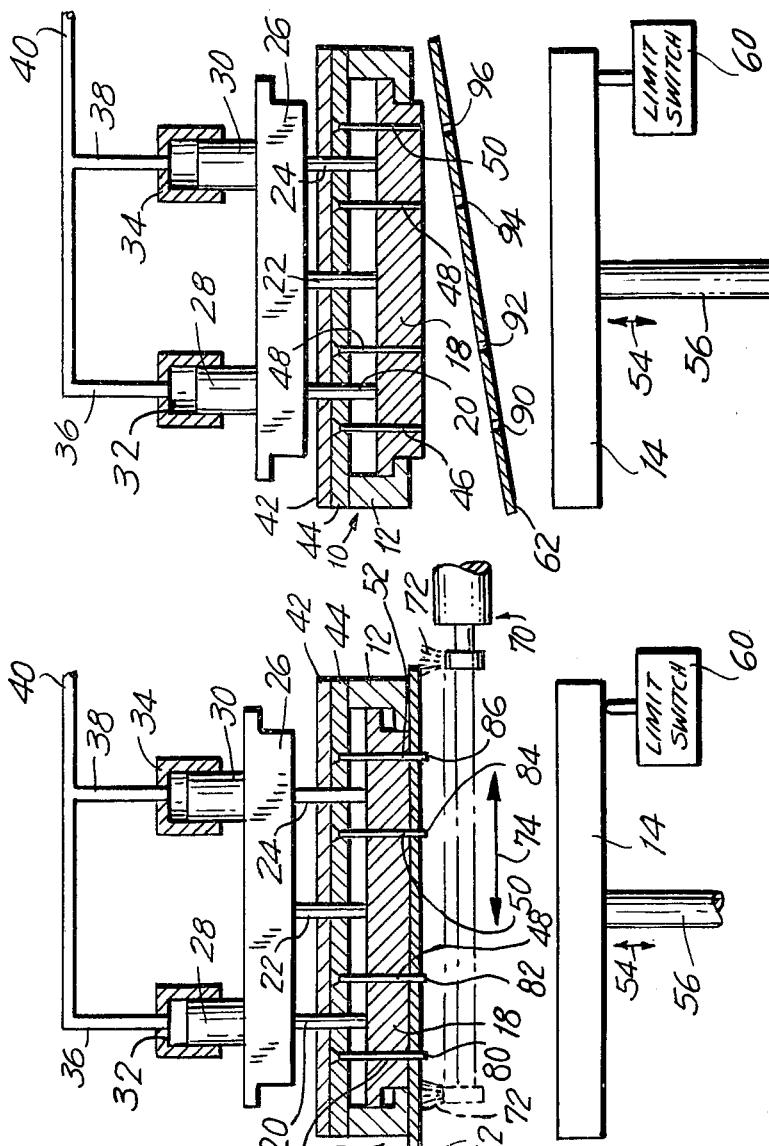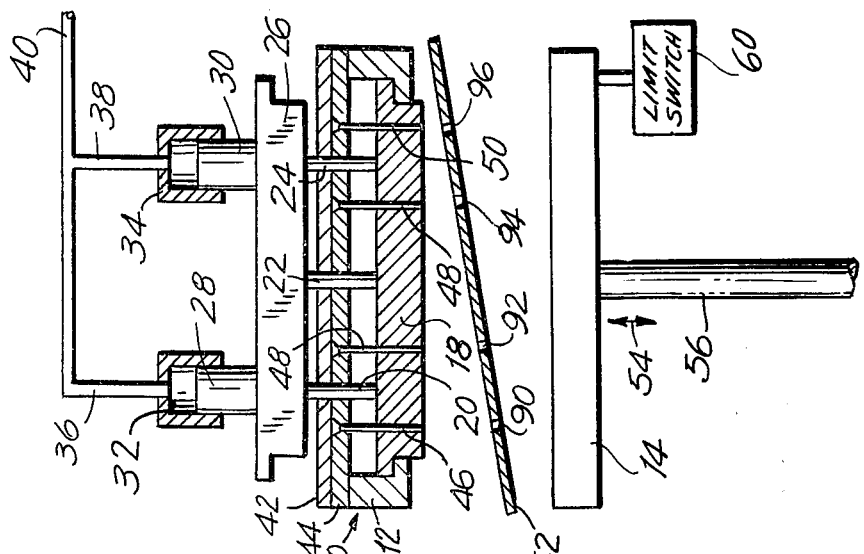

APPARATUS AND METHOD FOR PERFORATING AN ARTICLE

FIELD OF INVENTION

The invention relates to apparatus and processes for punching holes in articles such as printed circuit boards, and relates as well to cleaning devices such as brushes for cleaning die parts and the like.

BACKGROUND

From an examination of available patents in the field of brush type cleaners and the like, I have become aware of U.S. Pat. Nos. 200,142; 301,323; 642,220 and 761,842. While these patents show brushes and wipers for cleaning various parts of machines, nothing is shown which is useful in connection with die punches for printed circuit boards.

Printed circuit boards have become an important component in the production of many electronic products. The reliability of such boards is critical to an efficient and economical production of such products. One of the most important processes in manufacturing a printed circuit board is the perforation of holes in the non-metallic materials or in combinations of metallic and non-metallic materials constituting such boards.

A common problem in the production of printed circuit boards is that, in the course of punching holes in these boards, the slug or portion to be ejected is not completely removed. The most common cause of this problem is that the slug sticks to the end of the punch after the punch is extended through the board. When the punch is retracted or when the board is stripped from the punch, the slug is pulled back in the hole from which it came.

SUMMARY OF INVENTION

It is an object of the invention to provide an improved hole punching system and technique.

It is another object of the invention to provide an improved punch press to make holes in non-metallic materials or in combinations of metallic and non-metallic material so that a slug or pierced portion is reliably removed and does not form an obstruction in the associated hole.

Another object of the invention is to eliminate the need to clean manually the die punch portion of a punch press when said die punch portion is forced or extended through an article which has been punched.

Yet another object of the invention is to provide an integrated technique and apparatus to remove automatically slugs or pierced portions during normal punch-press cycles and die operations.

Still another object of the invention is to eliminate the need for secondary operations to clear holes which are partially or totally obstructed by slugs or pierced portions which were previously removed from said holes.

For achieving the above and other objects of the invention there is provided a punch apparatus comprising a die punch means to penetrate an article for punching at least one portion therefrom, said die portion means including at least one part extending through said article in the course of punching the same, cleaning means for cleaning said part with the latter extending through said article, and positioning means for extending the cleaning means into engagement with said part for cleaning the latter and for retracting said cleaning means from said part to permit detaching said article from said part.

In further accordance with the invention, there is provided means for stripping the article from the aforesaid part. The part may be, for example, a punching pin.

In accordance with a further provision of the invention, the die punch means includes elements reciprocal, in a relative sense, in first directions towards and away from each other, said cleaning means being reciprocal in second directions perpendicular to the first directions between positions, one of which is between said elements and the other of which is withdrawn from between said elements.

According to a further aspect of the invention, the aforesaid cleaning means may include a cleaning element which is displaceable in a direction perpendicular to the first and second directions mentioned above.

According to another feature of the invention, the cleaning element may include a brush. According to still another feature, the brush may have the form of an endless loop.

According to another advantageous feature of the invention, there may be provided means to permit extension of the cleaning means between the elements of the die punch means only when the elements are apart.

According to still a further feature of the invention, there may be provided means to permit relative reciprocation of the elements of said die punch means towards each other only when said cleaning means is not positioned between said elements.

In further accordance with the invention, there may be provided a pneumatic motor driving the aforesaid cleaning element. In accordance with another feature of the invention, there may be provided first and second pairs of telescopically related tubes, each pair including a hollow inner tube adapted to constitute part of a pneumatic circuit. The aforesaid motor is advantageously coupled in series between the aforesaid tubes.

According to yet another feature of the invention, the aforesaid positioning means may include a cylinder and piston arrangement for extending and retracting said cleaning means with a valve being provided coupling the cylinder and piston arrangement to the aforesaid circuit.

According to yet a further feature of the invention, means may be provided to control the time of movement of said cleaning means.

In accordance with yet another aspect of the invention, there is provided a method of punching a hole in an article comprising forcing a punch through said article so that the punch extends outside of the article, brushing from the punch any portions of the article that may have adhered thereto, and then separating the article from the punch.

The above and other objects, features and advantages of the invention will be found in greater detail in the following description as illustrated in the accompanying drawing.

BRIEF DESCRIPTION OF DRAWING

In the drawing which illustrates a preferred embodiment of the invention:

FIG. 1 is a side view of the punch press in a withdrawn position prior to punching of an article to be punched;

FIG. 2 is a side view of the punch press at a time when the die punch is extended through the article to be punched, the view further showing the retractable cleaning device;

FIG. 3 is a side view of the punch press at a time after the article has been punched and stripped from the punch press;

DETAILED DESCRIPTION

Figure 4:
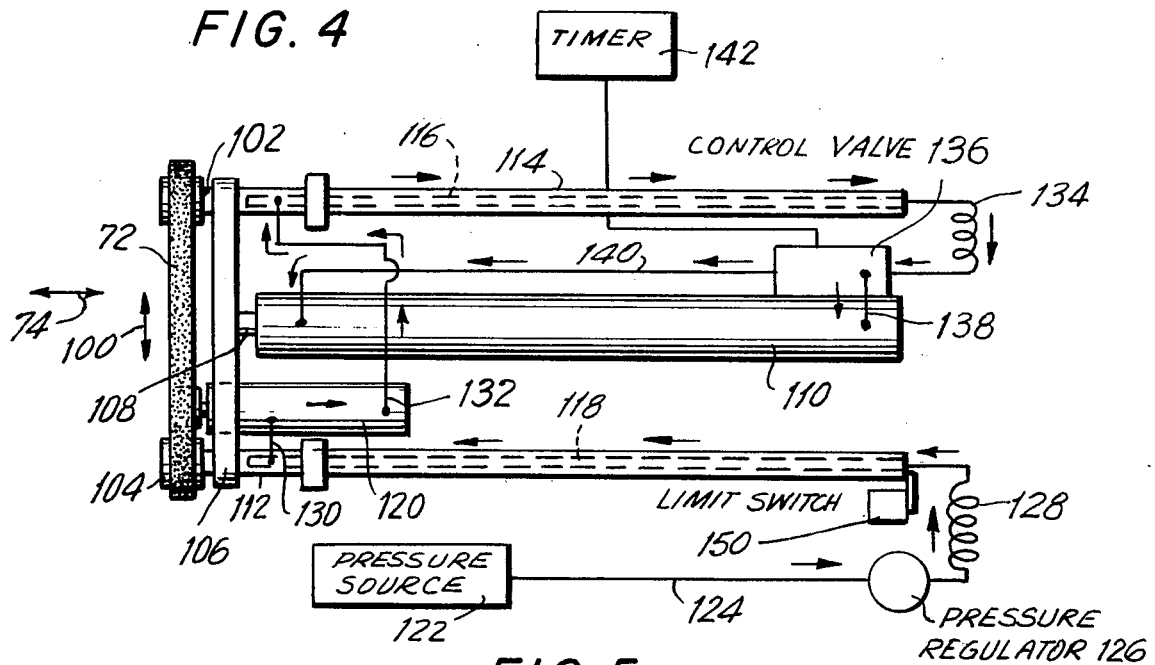
FIG. 4 is a top view of the retractable oscillating brush mechanism.

As stated hereinabove there is provided in accordance with the invention punch apparatus and die punch means to penetrate an article for punching at least one portion therefrom, said die punch means including at least one part extending through said article in the course of punching the same, cleaning means for cleaning said part with the latter extending through said article, and positioning means for extending said cleaning means into engagement with said part for cleaning the latter and retracting said cleaning means from said part to permit detaching said article from said part.

FIGS. 1, 2 and 3 illustrate a die punch provided in accordance with the invention with a cleaning device adapted for cleaning punch pins after the latter have been extended through an article to be punched. FIG. 1 illustrates the punch pins extending through the article to be punched, FIG. 2 illustrates the cleaning means extending between the elements of the die punch for purposes of cleaning the punch pins and FIG. 3 illustrates the separation of the punched article from the punch pins by a stripping operation.

More particularly, there is illustrated in FIGS. 1, 2 and 3 a die punch pin including an upper portion 12 and a lower portion 14. The elements 12 and 14 are reciprocal relative to each other in a relative sense. In any given operation or arrangement of parts, one of these elements may be stationary and the other reciprocal, the reciprocation between the two being thus in a relative sense.

Element 12 defines a cavity 16 within which is received the stripper element 18. The stripper element is coupled to pins 20, 22 and 24 in turn coupled to a displaceable head 26. The head 26 has coupled thereto pistons 28 and 30 which are respectively accommodated in cylinders 32 and 34. Cylinders 32 and 34 receive fluid pressure via lines 36 and 38 in turn coupled to a main line 40.

Also constituting part of element 12 is a plate 42 serving as a cover to a plate 44. Punch pins 46, 48, 50 and 52 are mounted on the plate 44. The pins 46, 48, 50 and 52 are shown for purposes of illustration only, it being obvious that a greater or lesser number of pins in any required arrangement may be provided.

In the illustrated embodiment, element 14 is the reciprocable element. It can be moved upwardly or downwardly in vertical direction indicated by the arrows 54. To provide for reciprocation of element 14 this plate is coupled to a rod 56 which is supplied with power by a hydraulic power source 58. A limit switch 60 is indicated in a position of interference with the element 14 for being contacted and operated by the element 14.

As shown in FIG. 1, the stripper 18 may have an upwardly withdrawn position whereby an article may be readily penetrated by pins 46, 48, 50 and 52. Such article is indicated at 62 and is, for example, a printed circuit board made of a non-metallic material or a combination of non-metallic and metallic materials in conventional manner. A further explanation of the construction of this article is not essential to an understanding of the invention.

FIG. 2 illustrates the same elements as were discussed relative to FIG. 1 with the exception that a cleaning device has been added to the illustration. This cleaning device is indicated generally at 70 and is shown to include a brush 72 which moves in reciprocal directions indicated by arrow 74. Thus, it is seen that the cleaning device moves generally in directions which are perpendicular to the directions of reciprocation relating to the die punch elements 12 and 14 and more specifically, the directions indicated by arrow 54.

In FIG. 2, it is seen that the element 14 has been withdrawn to a position of contact with the limit switch 60, thereby actuating the same for a purpose to be indicated more fully hereinafter. It is also seen quite clearly that the cleaning device is permitted with the elements 12 and 14 moved apart to be inserted between these elements to engage those portions of the punch pins 46, 48, 50 and 52 which have extended through and beyond the article 62. The parts of the punch pins which extend beyond and below the article 62 are indicated more particularly at 80, 82, 84 and 86.

Also to be noted in FIG. 2 is the fact that the stripper 24 has been moved downwardly by virtue of pressure applied through line 40 to a position of engagement with the article 62 but not sufficiently to a point whereby article 62 is disengaged from the pins 46, 48, 50 and 52.

According to FIG. 3, the cleaning device 70 with the cleaning element 72 thereon has been withdrawn. Element 14 is still in a lowered position. The stripper 24 has been further lowered within the element 12 to dislodge the article 62 from the punch pins. Cleared openings 90, 92, 94 and 96 appear in the article 62. It is these openings with which the invention is principally concerned. In the course of an ordinary die punch operation, it sometimes occurs that the portions to be ejected from the holes 90, 92, 94 and 96 cling or adhere to the parts 80, 82, 84 and 86 of the pins 46, 48, 50 and 52 respectively. Then upon a separation of the article 62 from the punch pins, these portions or slugs as they are sometimes called may be withdrawn into some of the holes 90, 92, 94 and 96 blocking the same and preventing the utilization of the holes 90, 92, 94 and 96 for their usual purpose.

A more particular illustration of the cleaning apparatus appears in FIG. 4. Therein appears the brush 72 referred to hereinabove. This brush which is shown for purposes of illustration only may be in the form of an endless loop. It may be driven continuously in either direction indicated by arrow 100 or may be oscillated back and forth in both directions indicated by this arrow. It will be noted that the arrow 100 will take an attitude which is perpendicular to both of the aforenoted directions indicated by arrows 54 and 74.

The illustrated brush is supported on two guides 102 and 104 in turn supported on a yoke 106 mounted on a rod 108 constituting a piston in a cylinder 110.

The yoke 106 is moreover mounted on two tubes 112 and 114 respectively and telescopically engaged with inner tubes 116 and 118 and forming pairs therewith. Displacement of the outer tubes 112 and 114 on inner tubes 116 and 118 provide for displacement of the cleaning element 72 in the direction indicated by the arrow 74 noted hereinabove relative to FIGS. 1-3.

The cleaning element 72 is driven by a pneumatic motor indicated generally at 120. Power to drive the motor 120 as well as to operate the cylinder 110 is provided by a pressure source 122 which may preferably be a source of pneumatic fluid. This pneumatic fluid passes via line 124 through a pressure regulator 126 via coil 128 into inner tube 118. From this inner tube it passes via line 130 to and through the motor 120 providing power for operating the same. This pressure fluid is then passed from the motor via line 132 to the inner tube 116 and from the tube 116 via coil 134 into a control valve indicated at 136.

The control valve 136 is connected via lines 138 and 140 to opposite ends of the cylinder 110. When pressure fluid is supplied via line 138, the piston 108 is extended and the cleaning element 72 is brought to a position between the elements 12 and 14 with respect to FIGS. 1-3. When pressure is supplied by control valve 136 via line 140 to the other end of cylinder 110, the piston 108 and cleaning element 72 are withdrawn. A timer 142 is indicated generally. This controls the period of reciprocation caused by control valve 132 and thereby controls the time of the excursion of the cleaning element 72 between die punch elements 12 and 14.

Also illustrated in FIG. 4 is a limit switch 150. This limit switch is engaged, for example, by the tube 112 during its maximum excursion to the right in FIG. 4.

Figure 5:
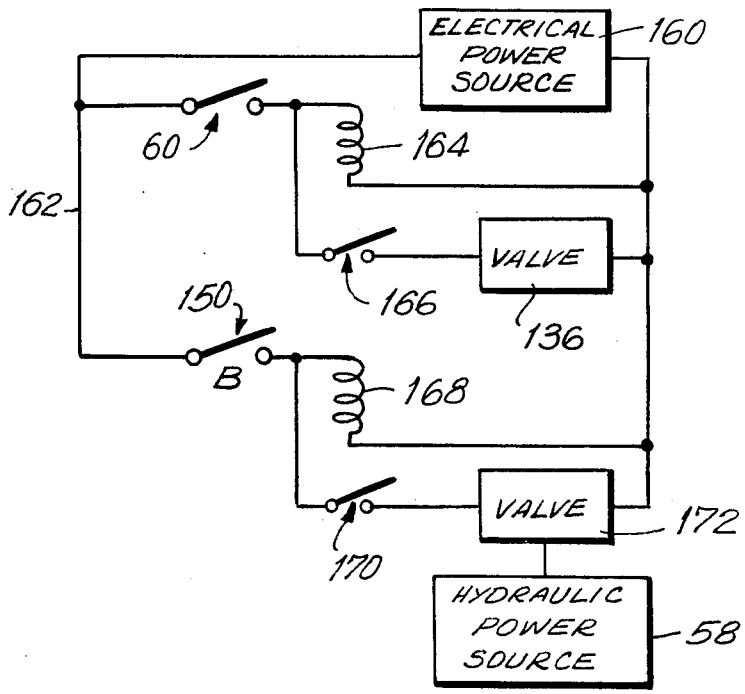
FIG. 5 is a schematic diagram of a control circuit for activating the punch press and oscillating brush mechanism.

A control circuit is illustrated in FIG. 5 consisting of electrical and pneumatic or hydraulic components. The purpose of this control circuit is to provide for permitting certain operations to occur only at certain times. Thus, for example, with reference to FIG. 2 above it is seen that the excursion of cleaning element 72 to the left between die punch elements 12 and 14 is desirable only when these two elements are apart. It is desired that the cleaning element 72 not be permitted to make such an excursion when die element 14 is in its uppermost position as illustrated in FIG. 1. The reason for this is that the automatic operation of cleaning element 72 as well as cleaning device 70 would be impeded and perhaps this equipment irreparably damaged should the operation be attempted while element 14 was in its uppermost position. For this reason, element 14 cooperates with limit switch 60 which is also illustrated in FIG. 5. More particularly, electrical power is provided from electrical power source 160 via line 162. The switch 60 selectively passes this power to relay coil 164 which in turn is capable of operating switch or armature 166 when properly actuated. This in turn controls the valve 136 which is a solenoid type valve previously referred to relative to FIG. 4. Thus it is seen that the position of element 14 controls limit switch 60 which in turn controls the operation of control valve 136. By these means an excursion of the cleaning elements in an attempt to clean the exposed portions pins 46, 48, 50 and 52 is prevented except when the elements 12 and 14 are relatively displaced to spaced apart positions.

In addition there is illustrated in FIG. 5 the limit switch 150 referred to hereinabove. This switch is likewise provided with power from the electrical power source 160 via line 162. It feeds this power to relay coil 168 in turn adapted to operate or control armature or switch 170. Switch 170 controls the supply of power to valve 172. Valve 172 is a part of the hydraulic power source 58 illustrated in FIG. 1. The purpose of the control of power source 58 is to prevent element 14 from being moved against the element 12 while the cleaning element 72 is extended therebetween. Thus it will be seen that power can be supplied for purposes of raising the element 14 only when the tube 112 illustrated in FIG. 4 is to its right-most excursion and thus is in engagement with the limit switch 150. Accordingly, damage to the cleaning device by virtue of untimely operation of element 14 is assured.

According to what has been described above, there has been provided in accordance with the invention a punch apparatus comprising a die punch to penetrate an article for punching at least one portion therefrom. This die punch includes at least one part or punch pin extending through the article in the course of punching the same. A cleaning device is provided for cleaning the extending part of the punch pin with the latter exposed through the article. There has also been illustrated a positioning apparatus for extending the cleaning device into engagement with the punch pins for cleaning the same and for retracting the cleaning device from between the die punch elements to permit detaching the article being punched from the punch pins. Also described hereinabove has been a stripping device for stripping the article from the part.

While a specific version of a die punch has been described, it will be noted that this die punch generally includes elements reciprocal, in a relative sense, in first directions towards and away from each other, said cleaning device being reciprocal in second directions perpendicular to the first directions between positions one of which is between said elements and the other of which is withdrawn from between said elements. It should be obvious that it would be possible to hold the element 14 stationary while reciprocating the element 12 relative thereto. It is also possible that both of these elements be mutually displaceable in a real sense.

From what has been stated above, it will also follow that the cleaning element which is provided is displaceable in a direction perpendicular to the first and second directions mentioned above. In other words, the arrow 100 indicates directions perpendicular to both the arrows 54 and 74.

There will now be obvious to those skilled in the art many modifications and variations of the apparatus set forth above. In fact, there is inherent in the above disclosure the disclosure of a method of punching a hole in an article. This method comprises forcing a punch through an article so that the punch extends outside of the article, brushing from the punch any portions of the article that may have adhered thereto, and then separating the article from the punch.

What is claimed is:

1. Punch apparatus comprising die punch means to penetrate an article for punching at least one portion therefrom, said die punch means including at least one part extending through said article in the course of punching the same, cleaning means for cleaning said part with the latter extending through said article, and positioning means for extending said cleaning means into engagement with said part for cleaning the latter and for retracting said cleaning means from said part to permit detaching said article from said part.

2. Punch apparatus as claimed in claim 1 comprising means for stripping said article from said part.

3. Punch apparatus as claimed in claim 1 wherein said part is a punching pin.

4. Punch apparatus as claimed in claim 1 wherein said die punch means includes elements reciprocable, in a relative sense, in first directions towards and away from each other, said cleaning means being reciprocable in second directions perpendicular to the first directions between positions one of which is between said elements and the other of which is withdrawn from between said elements.

5. Punch apparatus as claimed in claim 4 wherein said cleaning means includes a cleaning element which is displaceable in a direction perpendicular to said first and second directions.

6. Punch apparatus as claimed in claim 5 wherein said cleaning element includes a brush.

7. Punch apparatus as claimed in claim 4 comprising means to permit extension of said cleaning means between the elements of said die punch means only when said elements are apart.

8. Punch apparatus as claimed in claim 4 comprising means to permit relative reciprocation of the elements of said die punch means towards each other only when said cleaning means is not positioned between said elements.

9. Punch apparatus as claimed in claim 7 comprising means to permit relative reciprocation of the elements of said die punch means towards each other only when said cleaning means is not positioned between said elements.

10. Punch apparatus as claimed in claim 9 wherein said die punch means includes elements reciprocable, in a relative sense, in first directions towards and away from each other, said cleaning means being reciprocable in second directions perpendicular to the first directions between positions one of which is between said elements and the other of which is withdrawn from between said elements.

11. Punch apparatus as claimed in claim 10 comprising a pneumatic motor driving said cleaning element.

12. Punch apparatus as claimed in claim 11 comprising first and second pairs of telescopically related tubes, each pair including a hollow inner tube adapted to constitute part of a pneumatic circuit, said motor being coupled in series between said tubes.

13. Punch apparatus as claimed in claim 12 wherein said positioning means includes a cylinder and piston means for extending and retracting said cleaning means, and a valve coupling said cylinder and piston means to said circuit.

14. Punch apparatus as claimed in claim 13 comprising means to control the time of movement of said cleaning means.

15. Punch apparatus as claimed in claim 5 wherein said cleaning element has the form of an endless loop.

16. A method of punching a hole in an article comprising forcing a punch through said article so that the punch extends outside of the article, brushing from the punch any portions of the article that may have adhered thereto, and then separating the article from the punch.

* * * * *